(12) United States Patent
Iwazaki et al.

(10) Patent No.: US 11,381,178 B2
(45) Date of Patent: Jul. 5, 2022

(54) PIEZOELECTRIC DRIVE DEVICE AND ROBOT

(71) Applicant: SEIKO EPSON CORPORATION, Tokyo (JP)

(72) Inventors: Tomohisa Iwazaki, Shimosuwa-Machi (JP); Yutaka Arakawa, Hara-Mura (JP)

(73) Assignee: SEIKO EPSON CORPORATION, Tokyo (JP)

( * ) Notice: Subject to any disclaimer, the term of this patent is extended or adjusted under 35 U.S.C. 154(b) by 191 days.

(21) Appl. No.: 16/997,956

(22) Filed: Aug. 20, 2020

(65) Prior Publication Data

US 2021/0058010 A1   Feb. 25, 2021

(30) Foreign Application Priority Data

Aug. 21, 2019   (JP) .............................. JP2019-151027

(51) Int. Cl.
| | |
|---|---|
| *H02N 2/14* | (2006.01) |
| *H02N 2/10* | (2006.01) |
| *B25J 9/06* | (2006.01) |
| *H01L 41/04* | (2006.01) |
| *H02N 2/12* | (2006.01) |

(52) U.S. Cl.
CPC ................. *H02N 2/14* (2013.01); *B25J 9/06* (2013.01); *H01L 41/042* (2013.01); *H02N 2/103* (2013.01); *H02N 2/12* (2013.01)

(58) Field of Classification Search
CPC . H02N 2/14; H02N 2/103; H02N 2/12; H01L 41/042; B25J 9/06; B25J 9/12; B25J 18/00; B25J 19/00
See application file for complete search history.

(56) References Cited

U.S. PATENT DOCUMENTS

| 2004/0027032 A1* | 2/2004 | Moteki | .................. | H02N 2/006 310/323.02 |
|---|---|---|---|---|
| 2018/0323729 A1 | 11/2018 | Arakawa et al. | | |

FOREIGN PATENT DOCUMENTS

| JP | 2012210053 A | 10/2012 |
|---|---|---|
| JP | 2016010254 A | 1/2016 |
| JP | 2016063712 A | 4/2016 |
| JP | 2018186673 A | 11/2018 |
| JP | 2018191437 A | 11/2018 |

* cited by examiner

*Primary Examiner* — Emily P Pham (74) *Attorney, Agent, or Firm* — Gang Yu (57) ABSTRACT

A piezoelectric drive device includes a rotor having a driven part and rotating around a rotation axis, a vibrating unit having a piezoelectric element and applying a drive force for rotating the rotor to the driven part by displacement of the piezoelectric element, and a bearing supporting the rotor. The driven part has a first portion, a second portion, and a third portion sequentially connected, the first portion has a predetermined region along an axial direction of the rotation axis and coupled to an inner ring of the bearing within the predetermined region, the second portion overlaps with the bearing in a plan view from the axial direction, and the third portion has a contact surface in contact with the vibrating unit at an inner side of both ends of the predetermined region in a plan view from a direction perpendicular to the axial direction.

8 Claims, 6 Drawing Sheets

PIEZOELECTRIC DRIVE DEVICE AND ROBOT

The present application is based on, and claims priority from JP Application Serial Number 2019-151027, filed Aug. 21, 2019, the disclosure of which is hereby incorporated by reference herein in its entirety.

BACKGROUND

1. Technical Field

The present disclosure relates to a piezoelectric drive device and robot.

2. Related Art

JP-A-2016-063712 discloses a device including a driven member rotatable around a rotation axis and a vibrator rotating the driven member using a piezoelectric element. In this device, the vibrator is provided on the upside of the upper end surface of the driven member in contact with the upper end surface and rotates the driven member by vibration.

In the above described device, the vibrator and the driven member are arranged in the thickness direction of the driven member, i.e., the direction along the rotation axis, and downsizing of the device in the direction along the rotation axis of the driven member is difficult.

SUMMARY

According to an aspect of the present disclosure, a piezoelectric drive device is provided. The piezoelectric drive device includes a rotor having a driven part and rotating around a rotation axis, a vibrating unit having a piezoelectric element and applying a drive force for rotating the rotor to the driven part by displacement of the piezoelectric element, and a bearing supporting the rotor. The driven part has a first portion, a second portion, and a third portion sequentially connected in the order from the rotation axis toward an outer circumference side of the rotor, the first portion has a predetermined region along an axial direction of the rotation axis and coupled to an inner ring of the bearing within the predetermined region, the second portion overlaps with the bearing in a plan view from the axial direction, and the third portion has a contact surface in contact with the vibrating unit at an inner side of both ends of the predetermined region in a plan view from a direction perpendicular to the axial direction.

DESCRIPTION OF EXEMPLARY EMBODIMENTS

A. First Embodiment

Figure 1:
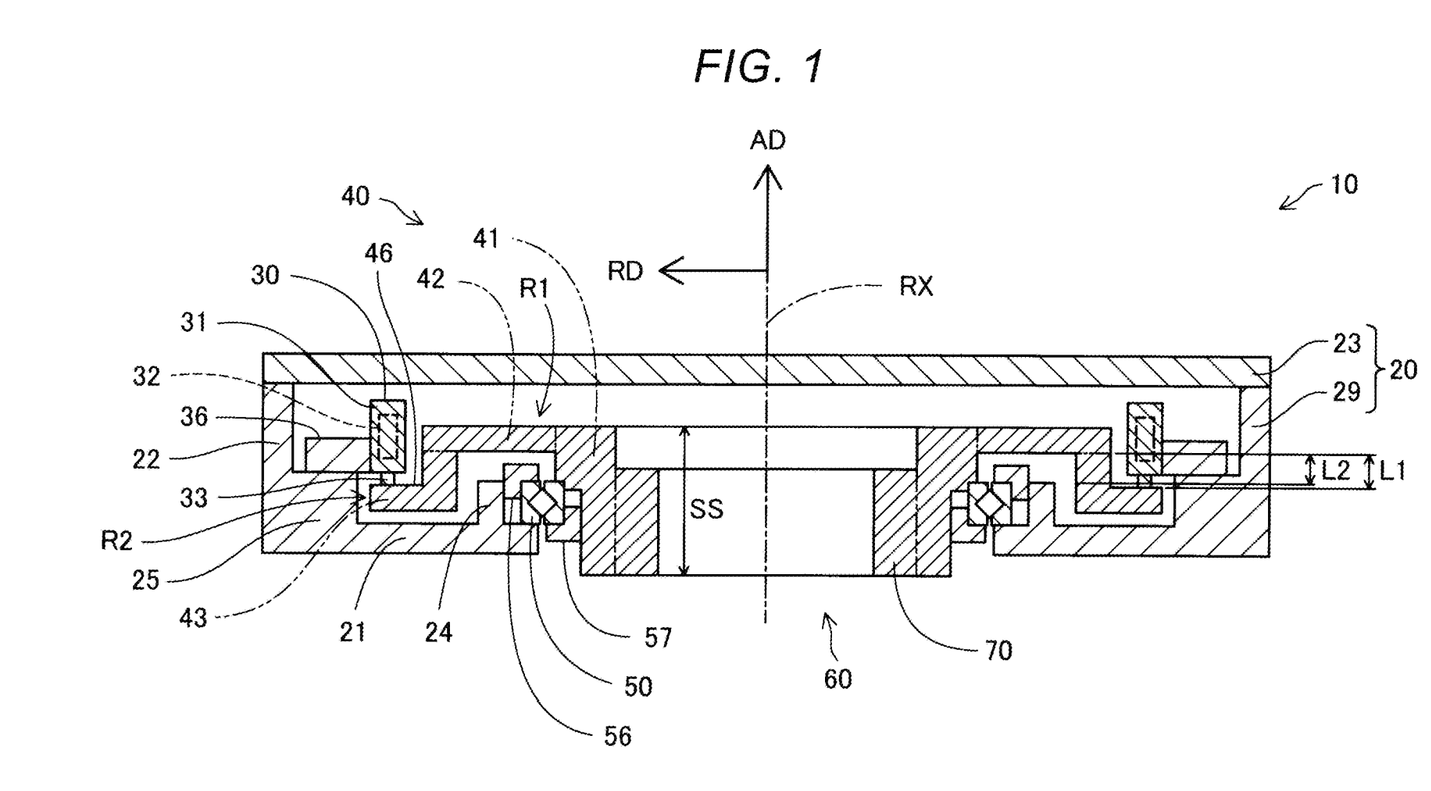
FIG. 1 is a first explanatory diagram showing a schematic configuration of a piezoelectric drive device of a first embodiment.
Figure 2:
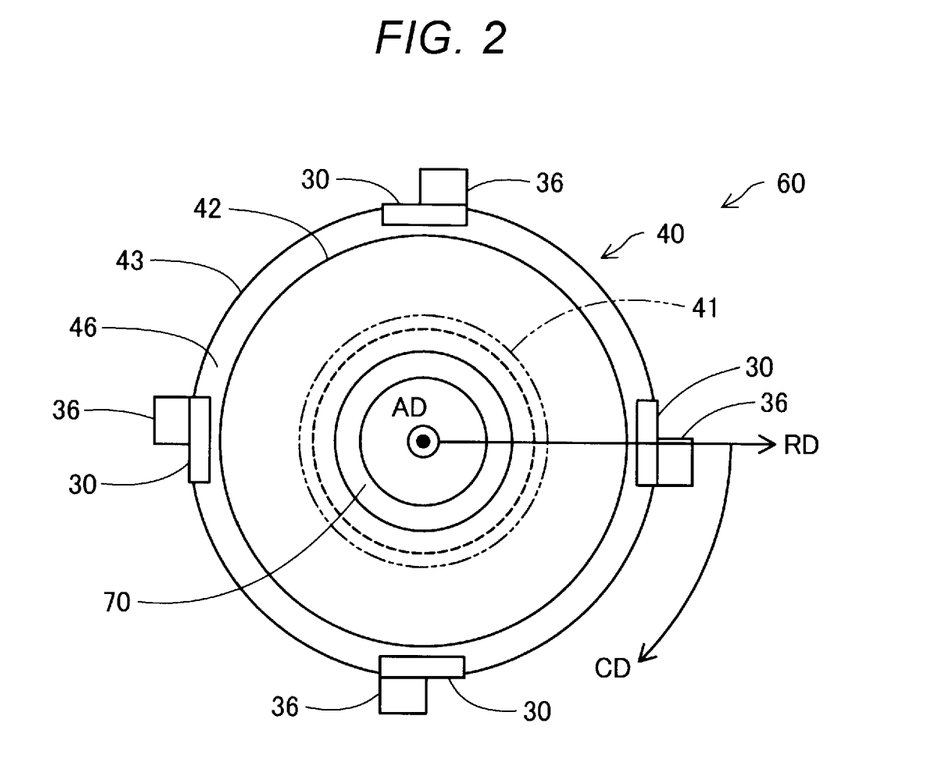
FIG. 2 is a second explanatory diagram showing the schematic configuration of the piezoelectric drive device of the first embodiment.

FIG. 1 is the first explanatory diagram showing the schematic configuration of a piezoelectric drive device 10 in the first embodiment. FIG. 2 is the second explanatory diagram showing the schematic configuration of the piezoelectric drive device 10 in the first embodiment. The piezoelectric drive device 10 in the embodiment includes a case 20 that partitions the outer shape of the piezoelectric drive device 10, a rotor 60 housed inside of the case 20, a bearing 50 that rotatably supports the rotor 60 relative to the case 20, and a vibrating unit 30 that applies a drive force to the rotor 60. The piezoelectric drive device 10 includes a plurality of the vibrating units 30. Each vibrating unit 30 includes a piezoelectric element 32 and generates the drive force for rotating the rotor 60 using deformation of the piezoelectric element 32. The rotation of the rotor 60 is transmitted to the outside of the piezoelectric drive device 10 via a rotation shaft part 70. Note that the piezoelectric drive device 10 may include an encoder that detects a rotation direction, rotation angle, and rotation speed of the rotor 60 relative to the case 20. The encoder may be an optical encoder or magnetic encoder. The piezoelectric drive device 10 may be also referred to as "ultrasonic motor" or "piezoelectric motor".

The case 20 includes a lower case 29 and a lid part 23. The lower case 29 includes a bottom surface part 21 and a side surface part 22 stood from the outer circumference edge of the bottom surface part 21 toward the lid part 23. The bottom surface part 21 is provided with an opening portion penetrated by the rotation shaft part 70 at the center thereof. In a position at the deeper side of the opening portion of the bottom surface part 21, a projecting portion 24 to which the outer ring of the bearing 50 is coupled is provided. At the inner side of the outer circumference edge of the bottom surface part 21, a step portion 25 to which the vibrating units 30 are coupled is provided. The coupling of the bearing 50 and the vibrating units 30 will be described later. The lid part 23 is coupled to the upper end portion of the side surface part 22 of the lower case 29 by screws after the bearing 50, the rotor 60, and the vibrating units 30 are coupled to the lower case 29. Note that a through hole for passage of a wire or the like may be provided in the lid part 23.

The vibrating unit 30 is fixed to the step portion 25 of the case 20 via a fixing member 36. The vibrating unit 30 includes a main body part 31 having the piezoelectric element 32 and an end portion 33 coupled to the main body part 31. An alternating current is supplied to the piezoelectric element 32, and thereby, the main body part 31 deforms with the piezoelectric element 32 and the end portion 33 vibrates. The end portion 33 repeatedly contacts the rotor 60 by vibration and applies the drive force to the rotor 60. In the embodiment, the vibrating unit 30 is fixed to the fixing member 36 by screws. The fixing member 36 is fixed to the step portion 25 by screws. Note that the specific configuration and motion of the vibrating unit 30 will be described later.

FIG. 2 shows the vibrating units 30 and the rotor 60 as seen from the lid part 23 toward the bottom surface part 21. In the piezoelectric drive device 10 in the embodiment, four of the vibrating units 30 are provided. The four vibrating units 30 are placed at equal intervals. Note that the number of vibrating units 30 provided in the piezoelectric drive device 10 is not limited to four, but may be one to three, five, or more. The vibrating units 30 are not necessarily placed at equal intervals.

The rotor 60 has the above described rotation shaft part 70 and a driven part 40 coupled to the rotation shaft part 70. In the embodiment, the rotor 60 has the hollow rotation shaft part 70 rotatable around a rotation axis RX. Note that the rotor 60 may have a solid rotation shaft part 70. A direction from the lower case 29 toward the lid part 23 along the rotation axis RX is referred to as "axial direction AD" and a direction orthogonal to the rotation axis RX from the rotation axis RX toward the outside is referred to as "radial direction RD". Further, the rotation direction of the rotor 60 is referred to as "circumferential direction CD". These directions AD, RD, CD are appropriately shown in the respective drawings.

The driven part 40 has a first portion 41, a second portion 42, and a third portion 43 sequentially connected in the order from the rotation axis RX toward the radial direction RD. In the embodiment, the rotation shaft part 70, the first portion 41, the second portion 42, and the third portion 43 are integrally formed. In FIGS. 1 and 2, the boundary line between the rotation shaft part 70 and the driven part 40 is shown by a dashed-two dotted line, the boundary line between the first portion 41 and the second portion 42 and the boundary line between the second portion 42 and the third portion 43 are shown by dashed-two dotted lines. The rotation shaft part 70 may be formed separately from the driven part 40. The third portion 43 may be formed separately from the first portion 41 and the second portion 42. The first portion 41 may be formed separately from the second portion 42 and the third portion 43. The first portion 41, the second portion 42, and the third portion 43 may be respectively separately formed. In these cases, the respective separately formed portions are fixed to be connected to one another by screws, welding, bonding, or the like. Note that the divisional positions of the respective portions shown in FIGS. 1 and 2 are shown for convenience of explanation, and may be appropriately set in view of the functions of the respective portions.

The first portion 41 fulfills a function of coupling the rotation shaft part 70 and the driven part 40 and a function of rotatably supporting the rotation shaft part 70 by the bearing 50. The first portion 41 is coupled to the rotation shaft part 70 along the radial direction RD. The first portion 41 occupies a predetermined region SS of the rotor 60 along the axial direction AD. In the embodiment, the first portion 41 has a cylindrical shape around the rotation axis RX. The inner ring of the bearing 50 contacts the first portion 41.

The second portion 42 fulfills a function of coupling the first portion 41 and the third portion 43 and has a shape without contact with the bearing 50. The second portion 42 is coupled to the first portion 41 in the radial direction RD. The second portion 42 has an annular shape around the rotation axis RX. The second portion 42 has a region R1 overlapping with the bearing 50 in a plan view from the axial direction AD.

The third portion 43 fulfills a function of receiving the drive forces from the vibrating units 30. The third portion 43 is coupled to the second portion 42 along the axial direction AD. In the embodiment, the third portion 43 has a bent shape. The third portion 43 includes a part having a cylindrical shape around the rotation axis RX and a part having an annular shape around the rotation axis RX. In the embodiment, the third portion 43 has a first surface 46 in contact with the vibrating units 30 at the inner side of both ends of the rotor 60 in the axial direction AD. The first surface 46 is a surface along the radial direction RD and the circumferential direction CD, in other words, a surface perpendicular to the rotation axis RX and opposite to the bearing 50 with the third portion 43 in between. A distance L1 between the first surface 46 and the second portion 42 in the axial direction AD is longer than a distance L2 between the center of the third portion 43 and the second portion 42 in the axial direction AD. The distance between the first surface 46 of the third portion 43 and the lid part 23 in the axial direction AD is longer than the distance between the first portion 41 and the lid part 23 in the axial direction AD. The third portion 43 has a region R2 overlapping with the bearing 50 in the plan view from the radial direction RD. The first surface 46 is placed in the region R2. That is, the first surface 46 is placed to overlap with the bearing 50 in the plan view from the radial direction RD.

In the embodiment, the rotor 60 is formed using an aluminum alloy. The rotor 60 may be formed not using the aluminum alloy, but using e.g. another metal material such as stainless steel or titanium alloy, a ceramic material, or a resin material. The third portion 43 of the driven part 40 may have a surface-treated layer e.g. an alumina layer, zirconia layer, barium titanate layer, or the like. The above described surface-treated layer is provided on the first surface 46 of the third portion 43, and thereby, friction of the first surface 46 due to contact with the vibrating units 30 may be suppressed.

The bearing 50 is provided outside of the first portion 41 of the rotor 60 in the radial direction RD. The bearing 50 rotatably supports the rotor 60 relative to the case 20. In the embodiment, a roller bearing having an annular shape around the rotation axis RX is used as the bearing 50. The bearing 50 may be e.g. a ball bearing, not the roller bearing. The rotor 60 is supported by the bearing 50, and thereby, the rotor 60 may smoothly rotate around the rotation axis RX.

The outer ring of the bearing 50 is sandwiched by a first supporting member 56 and the bottom surface part 21 of the case 20. The first supporting member 56 has an annular shape around the rotation axis RX. The section of the first supporting member 56 perpendicular to the circumferential direction CD has an L-shape. In the embodiment, threaded portions are respectively provided in the outer circumference side surface of the first supporting member 56 and the inner circumference side surface of the projecting portion 24 of the case 20, the threaded portions are fitted in each other, and thereby, the first supporting member 56 is fixed to the projecting portion 24.

The inner ring of the bearing 50 is sandwiched by a second supporting member 57 and the first portion 41 of the rotor 60. The second supporting member 57 has an annular shape around the rotation axis RX. The section of the second supporting member 57 perpendicular to the circumferential direction CD has an L-shape formed by rotation of the section of the first supporting member 56 by 180 degrees. In the embodiment, threaded portions are respectively provided in the outer circumference side surface of the rotation shaft part 70 of the rotor 60 and the inner circumference side surface of the second supporting member 57, the threaded portions are fitted in each other, and thereby, the second supporting member 57 is fixed to the rotor 60.

As shown in FIG. 1, the rotor 60 is rotatably coupled to the lower case 29 using the bearing 50, the first supporting member 56, and the second supporting member 57, and then, as shown in FIG. 2, the fixing member 36 with the vibrating unit 30 coupled thereto in advance is coupled to the lower case 29.

Figure 3:
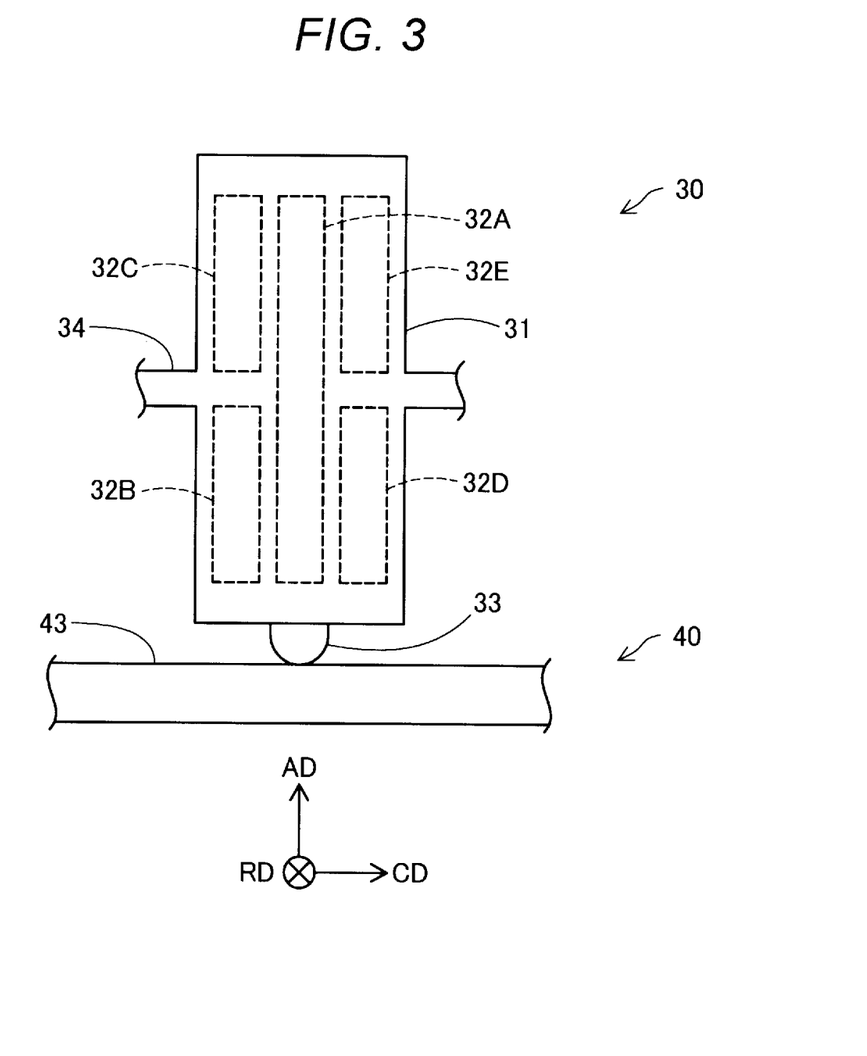
FIG. 3 is an explanatory diagram showing a configuration of a vibrating unit of the first embodiment.

FIG. 3 is the explanatory diagram showing the configuration of the vibrating unit 30. As described above, the vibrating unit 30 includes the main body part 31 and the end portion 33. The main body part 31 has a rectangular plate shape. The vibrating unit 30 is placed in orientation with the longitudinal direction of the main body part 31 along the axial direction AD. A supporting portion 34 that supports the main body part 31 is provided at the center of the long sides of the main body part 31. The supporting portion 34 is fixed to the fixing member 36 via an elastic member such as a spring (not shown). The end portion 33 is provided at the center of one short side of the main body part 31. The end portion 33 faces the third portion 43 of the driven part 40.

The main body part 31 has a first piezoelectric element 32A, a second piezoelectric element 32B, a third piezoelectric element 32C, a fourth piezoelectric element 32D, and a fifth piezoelectric element 32E. The respective piezoelectric elements 32A to 32E are placed along the longitudinal direction of the main body part 31. In FIG. 3, the first piezoelectric element 32A is placed at the center of the main body part 31. The second piezoelectric element 32B and the third piezoelectric element 32C are placed at the left side of the first piezoelectric element 32A. The second piezoelectric element 32B is placed at the downside of the supporting portion 34. The third piezoelectric element 32C is placed at the upside of the supporting portion 34. The fourth piezoelectric element 32D and the fifth piezoelectric element 32E are placed at the right side of the first piezoelectric element 32A. The fourth piezoelectric element 32D is placed at the downside of the supporting portion 34. The fifth piezoelectric element 32E is placed at the upside of the supporting portion 34.

Each of the piezoelectric elements 32A to 32E includes a piezoelectric material with electrodes provided on both sides thereof, and a pair of vibrating plates that sandwich the piezoelectric material. In the embodiment, the piezoelectric material is formed using lead zirconate titanate. The piezoelectric material may be formed using barium titanate or quartz crystal, not the lead zirconate titanate. The vibrating plate is formed using silicon. The piezoelectric material and the vibrating plates are bonded using an insulating adhesive agent. The electrodes are coupled to a power supply via a switching element (not shown) by wires (not shown).

In the embodiment, the main body part 31 and the supporting portion 34 are integrally formed. The main body part 31 and the supporting portion 34 are formed using silicon. The end portion 33 is preferably formed using a material having high abrasion resistance. In the embodiment, the end portion 33 is formed using alumina.

Figure 4:
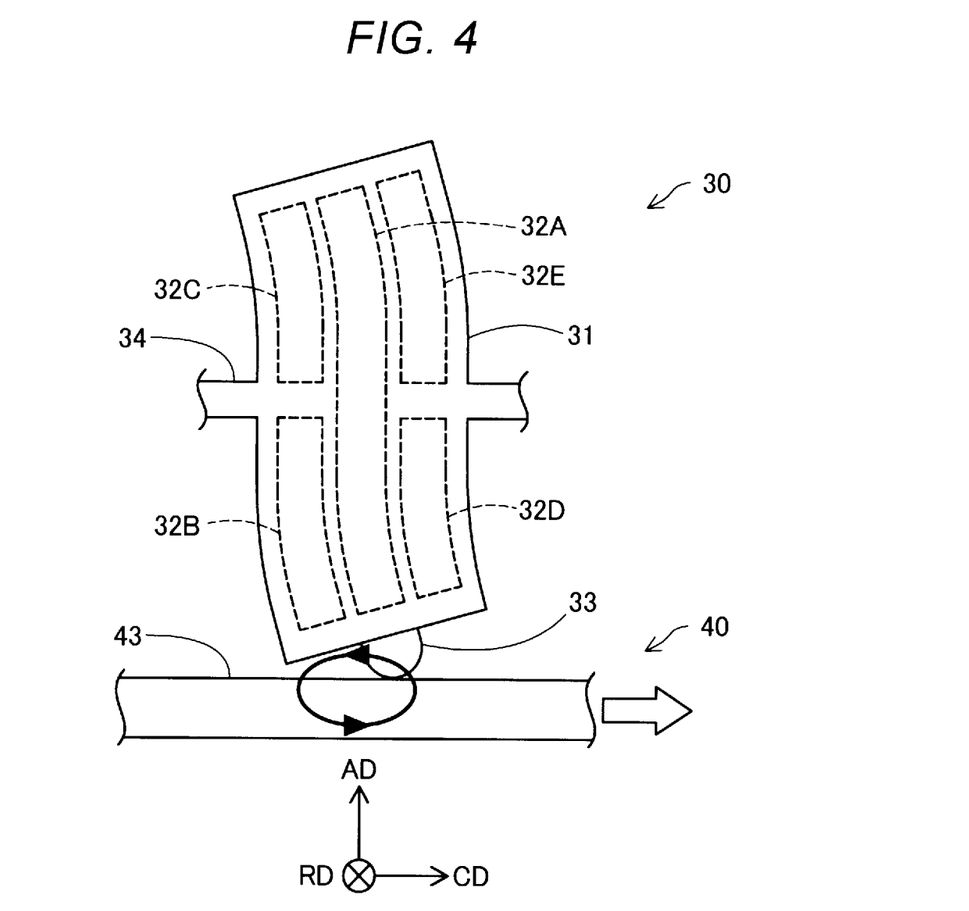
FIG. 4 is an explanatory diagram showing motion of the vibrating unit of the first embodiment.

FIG. 4 is the explanatory diagram showing the motion of the vibrating unit 30. The phase of the alternating current supplied to the second piezoelectric element 32B and the fifth piezoelectric element 32E and the phase of the alternating current supplied to the third piezoelectric element 32C and the fourth piezoelectric element 32D are set to be different by 180 degrees and the phase of the alternating current supplied to the first piezoelectric element 32A and the phase of the alternating current supplied to the second piezoelectric element 32B and the fifth piezoelectric element 32E are set to be different by 90 degrees, and thereby, the main body part 31 may be two-dimensionally deformed to make elliptic motion of the end portion 33. The end portion 33 repeats the elliptic motion, and thereby, the end portion 33 and the third portion 43 of the driven part 40 are repeatedly brought into contact. When the end portion 33 and the third portion 43 contact, the end portion 33 transmits the drive force along the circumferential direction CD to the third portion 43. Accordingly, while the end portion 33 repeats the elliptic motion, the driven part 40 rotates around the rotation axis RX. Note that the alternating currents supplied to the above described respective piezoelectric elements 32A to 32E are inverted by 180 degrees, and thereby, the driven part 40 may be rotated in the opposite direction.

As above, according to the piezoelectric drive device 10 of the described embodiment, the vibrating units 30 and the rotor 60 may be placed to overlap in the plan view from the radial direction RD. Accordingly, the piezoelectric drive device 10 may be downsized in the axial direction AD. Particularly, in the embodiment, the piezoelectric drive device 10 in which the end portions 33 of the vibrating units 30 and the third portion 43 of the rotor 60 are arranged along the axial direction AD may be downsized in the axial direction AD.

Further, in the embodiment, the first surface 46 of the third portion 43 in contact with the vibrating units 30 is provided at the opposite side to the bearing 50 with the third portion 43 in between. Accordingly, entry of abrasion powder produced due to the contact between the vibrating units 30 and the first surface 46 into the bearing 50 may be suppressed, and interference with the rotation of the rotor 60 may be suppressed.

In the embodiment, the first surface 46 is provided in a position farther from the second portion 42 than the center of the third portion 43 in the axial direction AD. Accordingly, clearance for placement of the vibrating units 30 may be secured between the first surface 46 and the lid part 23, and the effect of downsizing of the piezoelectric drive device 10 in the axial direction AD may be increased.

Further, in the embodiment, the third portion 43 has the region R2 overlapping with the bearing 50 in the plan view from the radial direction RD. Accordingly, the clearance for placement of the vibrating units 30 may be easily secured between the first surface 46 and the lid part 23, and the effect of downsizing of the piezoelectric drive device 10 in the axial direction AD may be increased.

In the embodiment, the first surface 46 is placed to overlap with the bearing 50 in the plan view from the radial direction RD. Accordingly, the clearance for placement of the vibrating units 30 may be secured between the first surface 46 and the lid part 23, and the effect of downsizing of the piezoelectric drive device 10 in the axial direction AD may be increased.

B. Second Embodiment

Figure 5:
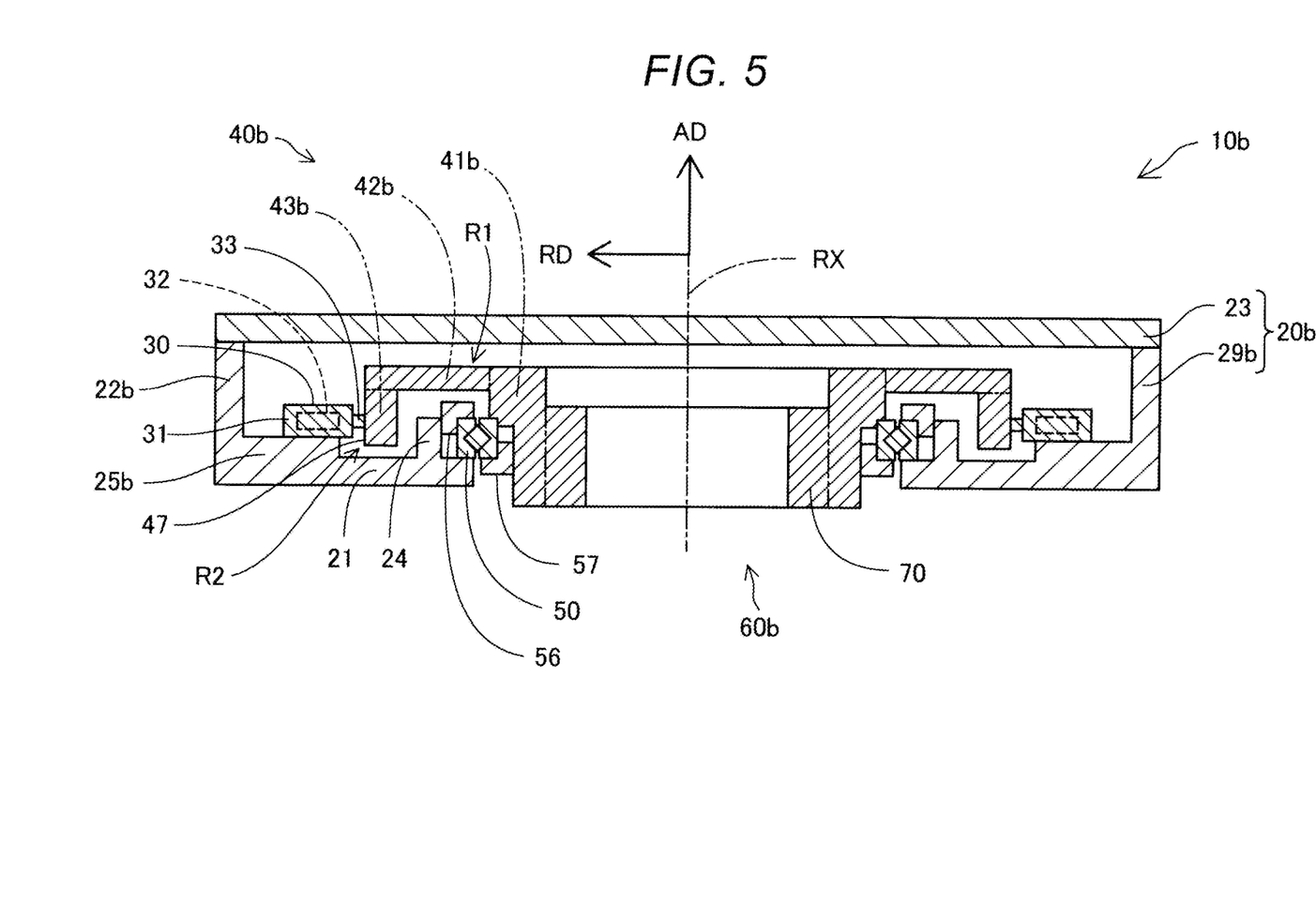
FIG. 5 is an explanatory diagram showing a schematic configuration of a piezoelectric drive device of a second embodiment.

FIG. 5 is the explanatory diagram showing the schematic configuration of a piezoelectric drive device 10b in the second embodiment. In the piezoelectric drive device 10b in the second embodiment, the direction of the vibrating units 30 relative to a case 20b and the configuration of a driven part 40b of a rotor 60b are different from those of the first embodiment. The rest of the configuration is the same as the first embodiment shown in FIG. 1 unless otherwise described.

The vibrating unit 30 is placed inside of the case 20b so that the longitudinal direction of the main body part 31 may be along the radial direction RD. In the embodiment, the fixing member 36 for fixing the vibrating unit 30 is not provided and the vibrating unit 30 is fixed to a step portion 25b of a lower case 29b. Note that, in the embodiment, the height of the step portion 25b along the axial direction AD is lower than the height of the step portion 25 of the first embodiment. The height of a side surface part 22b along the axial direction AD is lower than the height of the side surface part 22 of the first embodiment.

A third portion 43b provided in the driven part 40b of the rotor 60b does not have the bent shape, but has only a portion having a cylindrical shape around the rotation axis RX. The third portion 43b has a second surface 47 as a cylindrical surface around the rotation axis RX. The second surface 47 is placed on the outer circumference side surface of the third portion 43b. The end portion 33 of the vibrating unit 30 contacts the second surface 47. Note that a first portion 41b has the same shape as the first portion 41 of the first embodiment and a second portion 42b has the same shape as the second portion 42 of the first embodiment.

As above, according to the piezoelectric drive device 10b of the described embodiment, the second surface 47 in contact with the vibrating unit 30 is provided as the cylindrical surface around the rotation axis RX in the third portion 43b of the driven part 40b. Accordingly, the vibrating unit 30 may be placed so that the longitudinal direction of the main body part 31 may be along the radial direction RD. Therefore, the piezoelectric drive device 10b in the axial direction AD may be further downsized compared to the piezoelectric drive device 10 of the first embodiment.

C. Third Embodiment

Figure 6:
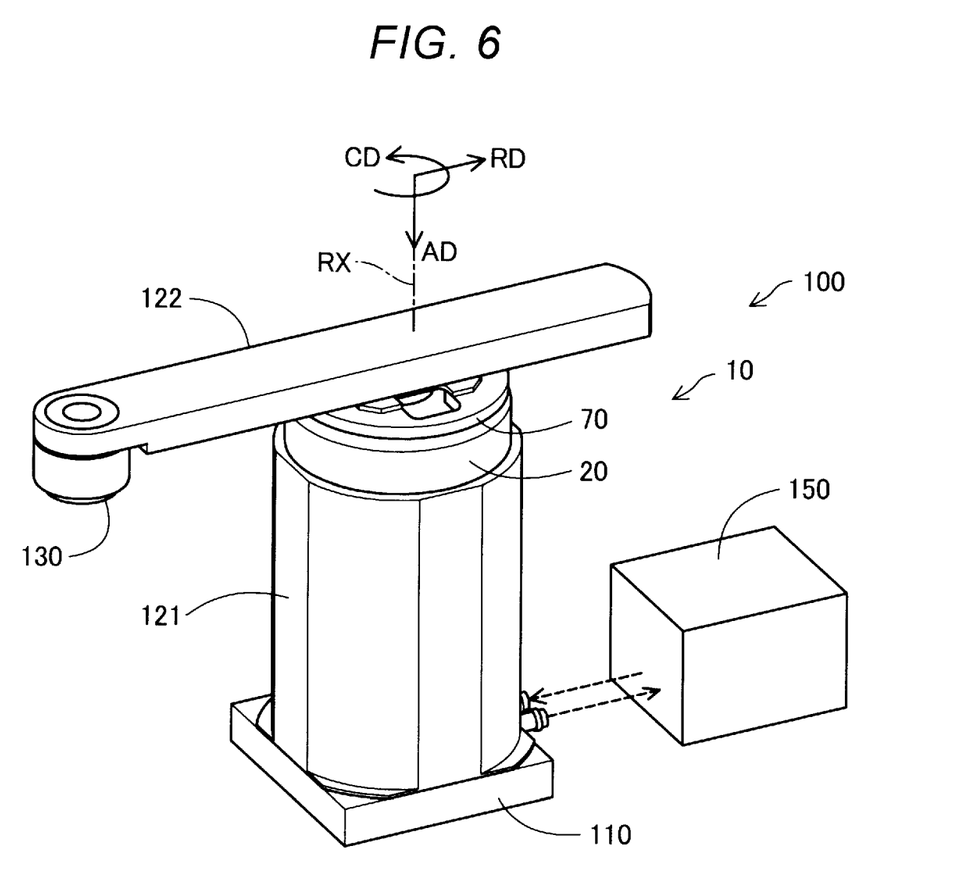
FIG. 6 is an explanatory diagram showing a schematic configuration of a robot of a third embodiment.

FIG. 6 is a perspective view showing the schematic configuration of a robot 100 in the third embodiment. The robot 100 in the embodiment includes the piezoelectric drive device 10 described in the first embodiment, a base 110, a first arm 121 coupled to the base 110, a second arm 122 coupled to the first arm 121 via the piezoelectric drive device 10, and a control unit 150. The robot 100 performs e.g. transport of precision apparatuses and assembly of precision apparatuses under control of the control unit 150. Note that, in FIG. 6, the piezoelectric drive device 10 is placed upside down relative to the orientation shown in FIG. 1.

One end of the first arm 121 is fixed to the base 110. The case 20 of the piezoelectric drive device 10 is fixed to the other end of the first arm 121. One end of the second arm 122 is fixed to the rotation shaft part 70 of the piezoelectric drive device 10. An attachment portion 130 to which an end effector is coupled is provided at the other end of the second arm 122. The second arm 122 is driven by the piezoelectric drive device 10 and rotates relative to the first arm 121. That is, in the embodiment, the piezoelectric drive device 10 has a function as a joint in the robot 100.

The control unit 150 includes a computer having one or more processors, a main memory, and an input/output interface for external input and output signals. In the embodiment, the control unit 150 controls the operation of the robot 100 by executing programs and commands read onto the main memory using the processors. The operation of the robot 100 includes rotation of the rotation shaft part 70 of the piezoelectric drive device 10. Note that the control unit 150 may be configured by a combination of a plurality of circuits, not the computer.

As above, according to the robot 100 of the described embodiment, the first arm 121 and the second arm 122 are coupled via the piezoelectric drive device 10 described in the first embodiment. Accordingly, the joint part of the robot 100 may be downsized in the axial direction AD. Particularly, in the robot 100 of the embodiment, the entire robot 100 may be downsized in the axial direction AD. Note that, in the robot 100, the first arm 121 and the second arm 122 may be coupled via the piezoelectric drive device 10b described in the second embodiment.

D. Other Embodiments (D1) In the piezoelectric drive device 10 in the above described first embodiment, the first surface 46 in contact with the vibrating unit 30 is provided along the radial direction RD. On the other hand, the first surface 46 may be provided along a direction inclined relative to the radial direction RD. In this case, the vibrating unit 30 may be placed with inclination relative to the radial direction RD, and thereby, the piezoelectric drive device 10 may be further downsized in the axial direction AD.

(D2) In the piezoelectric drive device 10b in the above described second embodiment, the second surface 47 in contact with the vibrating unit 30b is provided as the cylindrical surface around the rotation axis RX. On the other hand, the second surface 47 may be provided along a direction inclined relative to the axial direction AD. In this case, the vibrating unit 30 may be placed with inclination relative to the axial direction AD, and thereby, upsizing of the piezoelectric drive device 10b in the radial direction RD may be suppressed and the piezoelectric drive device 10b may be downsized in the axial direction AD.

(D3) In the piezoelectric drive device 10 in the above described first embodiment, the first surface 46 in contact with the vibrating unit 30 is the surface perpendicular to the rotation axis RX and provided on the opposite side to the bearing 50 with the third portion 43 in between. On the other hand, the first surface 46 may be the surface perpendicular to the rotation axis RX and provided on a surface facing the bottom surface part 21 of the case 20. In this case, the vibrating unit 30 is placed between the third portion 43 and the bottom surface part 21 of the case 20.

(D4) In the piezoelectric drive device 10 in the above described first embodiment, the distance L1 between the first surface 46 and the second portion 42 in the axial direction AD is longer than the distance L2 between the center of the third portion 43 and the second portion 42 in the axial direction AD. On the other hand, the distance L1 between the first surface 46 and the second portion 42 in the axial direction AD may be the same as the distance L2 between the center of the third portion 43 and the second portion 42 in the axial direction AD or shorter than the distance L2 between the center of the third portion 43 and the second portion 42 in the axial direction AD. Even in this case, the vibrating units 30 and the rotor 60 may be placed to overlap in the plan view from the radial direction RD, and thereby, the piezoelectric drive device 10 may be downsized in the axial direction AD.

(D5) In the piezoelectric drive devices 10, 10b in the above described respective embodiments, the third portions 43, 43b of the driven parts 40, 40b have the regions R2 overlapping with the bearings 50 in the plan view from the radial direction RD. On the other hand, the third portions 43, 43b do not necessarily have regions overlapping with the bearings 50 in the plan view from the radial direction RD.

(D6) In the piezoelectric drive devices 10, 10b in the above described respective embodiments, in the regions R2 overlapping with the bearings 50 in the plan view from the radial direction RD, the vibrating units 30 contact the third portions 43, 43b. On the other hand, the vibrating units 30 may contact the third portions 43, 43b in regions of the third portions 43, 43b not overlapping with the bearings 50 in the plan view from the radial direction RD.

(D7) In the piezoelectric drive devices 10, 10b in the above described respective embodiments, the second portions 42, 42b of the driven parts 40, 40b have the annular shapes around the rotation axis RX. On the other hand, if the second portions 42, 42b fulfill the functions of coupling the first portions 41, 41b and the third portions 43, 43b and do not in contact with the bearings 50, the second portions 42, 42b may be provided in other various shapes than the annular shapes. For example, the second portions 42, 42b may be radially provided like spokes of wheels between the first portions 41, 41b and the third portions 43, 43b. In this case, the weights of the rotors 60, 60b may be reduced.

E. Other Aspects

The present disclosure is not limited to the above described embodiments, but may be realized in various aspects without departing from the scope thereof. For example, the present disclosure can be realized in the following aspects. The technical features in the above described embodiments corresponding to the technical features in the respective aspects described as below can be appropriately replaced or combined for solving part or all of the problems of the present disclosure or achieving part or all of the effects of the present disclosure. Further, the technical features may be appropriately deleted unless the technical features are described as essential features in the specification.

(1) According to one aspect of the present disclosure, a piezoelectric drive device is provided. The piezoelectric drive device includes a rotor having a driven part and rotating around a rotation axis, a vibrating unit having a piezoelectric element and applying a drive force for rotating the rotor to the driven part by displacement of the piezoelectric element, and a bearing supporting the rotor. The driven part has a first portion, a second portion, and a third portion sequentially connected in the order from the rotation axis toward an outer circumference side of the rotor, the first portion has a predetermined region along an axial direction of the rotation axis and coupled to an inner ring of the bearing within the predetermined region, the second portion overlaps with the bearing in a plan view from the axial direction, and the third portion has a contact surface in contact with the vibrating unit at an inner side of both ends of the predetermined region in a plan view from a direction perpendicular to the axial direction.

According to the piezoelectric drive device of the aspect, the vibrating unit and the rotor may be placed so that the vibrating unit may overlap with the rotor in the plan view from the direction perpendicular to the axial direction. Therefore, the piezoelectric drive device may be downsized in the axial direction.

(2) In the piezoelectric drive device of the above described aspect, the contact surface may be a surface perpendicular to the rotation axis.

According to the piezoelectric drive device of the aspect, the piezoelectric drive device in which the vibrating unit and the third portion are arranged in the axial direction may be downsized in the axial direction.

(3) In the piezoelectric drive device of the above described aspect, the contact surface may be a surface opposite to a surface facing the bearing of the third portion with respect to the third portion.

According to the piezoelectric drive device of the aspect, entry of abrasion powder produced due to the contact between the vibrating unit and the rotor into the bearing may be suppressed. Therefore, interference with the rotation of the rotor may be suppressed.

(4) In the piezoelectric drive device of the above described aspect, a distance between the contact surface and the second portion along the axial direction may be longer than a distance between a center of the third portion and the second portion along the axial direction.

According to the piezoelectric drive device of the aspect, the effect of downsizing of the piezoelectric drive device in the axial direction may be increased.

(5) In the piezoelectric drive device of the above described aspect, the contact surface may be a cylindrical surface around the rotation axis.

According to the piezoelectric drive device of the aspect, the effect of downsizing of the piezoelectric drive device in the axial direction may be increased.

(6) In the piezoelectric drive device of the above described aspect, the third portion may have a region overlapping with the bearing in the plan view from the direction perpendicular to the rotation axis.

According to the piezoelectric drive device of the aspect, the effect of downsizing of the piezoelectric drive device in the axial direction may be increased.

(7) In the piezoelectric drive device of the above described aspect, the contact surface may overlap with the bearing in the plan view from the direction perpendicular to the rotation axis.

According to the piezoelectric drive device of the aspect, the effect of downsizing of the piezoelectric drive device in the axial direction may be increased.

The present disclosure can be realized in other various aspects than the piezoelectric drive device, e.g., an aspect of a robot or the like.

What is claimed is:
1. A piezoelectric drive device comprising:
   a rotor having a driven part and rotating around a rotation axis;
   a vibrating unit having a piezoelectric element and applying a drive force for rotating the rotor to the driven part by displacement of the piezoelectric element; and
   a bearing supporting the rotor, wherein
   the driven part has a first portion, a second portion, and a third portion sequentially connected in the order from the rotation axis toward an outer circumference side of the rotor,
   the first portion has a predetermined region along an axial direction of the rotation axis and coupled to an inner ring of the bearing within the predetermined region,
   the second portion overlaps with the bearing in a plan view from the axial direction, and
   the third portion has a contact surface in contact with the vibrating unit at an inner side of both ends of the predetermined region in a plan view from a direction perpendicular to the axial direction.
2. The piezoelectric drive device according to claim 1, wherein
   the contact surface is a surface perpendicular to the rotation axis.
3. The piezoelectric drive device according to claim 1, wherein
   the contact surface is a surface opposite to a surface facing the bearing of the third portion with respect to the third portion.

4. The piezoelectric drive device according to claim 2, wherein
   a distance between the contact surface and the second portion along the axial direction is longer than a distance between a center of the third portion and the second portion along the axial direction.

5. The piezoelectric drive device according to claim 1, wherein
   the contact surface is a cylindrical surface around the rotation axis.

6. The piezoelectric drive device according to claim 1, wherein
   the third portion has a region overlapping with the bearing in the plan view from the direction perpendicular to the rotation axis.

7. The piezoelectric drive device according to claim 6, wherein
   the contact surface overlaps with the bearing in the plan view in the direction perpendicular to the rotation axis.

8. A robot comprising:
   a first arm;
   a second arm rotating relative to the first arm; and
   the piezoelectric drive device according to claim 1 driving the second arm.

* * * * *